United States Patent
Wang

(10) Patent No.: US 6,529,052 B2
(45) Date of Patent: Mar. 4, 2003

(54) FREQUENCY MULTIPLIER BASED ON EXCLUSIVE-OR GATE AND FREQUENCY DIVIDER

(75) Inventor: Zhenhua Wang, Zürich (CH)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/847,218

(22) Filed: May 2, 2001

(65) Prior Publication Data

US 2001/0054919 A1 Dec. 27, 2001

(30) Foreign Application Priority Data

May 3, 2000 (FR) .............................. 00 05640

(51) Int. Cl.[7] .............................................. H03B 19/00
(52) U.S. Cl. ...................... 327/120; 327/116; 327/254; 377/47; 708/103
(58) Field of Search ................. 327/113–117, 119–122, 327/165, 166, 415, 238, 236, 357, 359, 254, 10, 12, 42, 43, 44, 49; 377/47, 48; 708/101, 103; 331/25, 17, 50–53; 455/205, 214, 216; 326/52, 53, 54

(56) References Cited

U.S. PATENT DOCUMENTS

| | | | | |
|---|---|---|---|---|
| 4,020,422 A | * | 4/1977 | Underhill ...................... | 327/12 |
| 4,590,440 A | * | 5/1986 | Haque et al. .................. | 331/17 |
| 4,689,577 A | * | 8/1987 | Vreeken et al. ............... | 327/12 |
| 5,180,994 A | * | 1/1993 | Martin et al. .................. | 331/38 |
| 5,864,246 A | | 1/1999 | Anderson ..................... | 327/122 |
| 6,154,482 A | * | 11/2000 | Inuzuka ....................... | 375/130 |

* cited by examiner

Primary Examiner—Minh Nguyen
(74) Attorney, Agent, or Firm—Steven R. Biren

(57) ABSTRACT

An electronic device which includes a periodic signal generator (12) and a frequency multiplier circuit (14) for multiplying the frequency of the periodic signal. The multiplier circuit is formed on the basis of an EXCLUSIVE-OR gate (20), which receives the periodic signal, and a frequency divider circuit (22) connected between the output and an input of the gate. From this divider circuit it is possible to derive in a very simple way quadrature signals, which makes it feasible to perform a modulation of the type known as "zero demodulation". The multiplier circuit can operate in accordance with CML technology (Current Mode Logic).

12 Claims, 3 Drawing Sheets

FREQUENCY MULTIPLIER BASED ON EXCLUSIVE-OR GATE AND FREQUENCY DIVIDER

BACKGROUND OF THE INVENTION

This invention relates to an electronic device comprising a generator of periodic signals and at least a frequency multiplier circuit for multiplying their frequency, formed on the basis of an <<EXCLUSIVE-OR>> gate which receives said periodic signals.

The invention finds highly significant applications notably in the field of telecommunications using high frequencies.

Such a device is known from the patent document U.S. Pat. No. 5,864,246. In this patent document it is proposed to use a phase shifting element which produces a delayed replica of the clock signal, so that an EXCLUSIVE-OR gate, by combining the clock signal and the replica, produces the signal at double frequency.

The device known from this patent document has the drawback that the replicas of judiciously phase-shifted high-frequency signals are not easy to realize, notably at high frequencies, and are thus costly to implement.

SUMMARY OF THE INVENTION

The present invention proposes a device of the type defined in the opening paragraph, which avoids the use of such phase shifting elements.

Therefore, such a device is characterized in that it comprises a frequency divider circuit connected between the output and an input of said EXCLUSIVE-OR gate.

According to a preferred embodiment of the invention, such a device is characterized in that said multiplier circuit has outputs for producing signals which are phase shifted by 90° at the frequency of said periodic signals.

This embodiment offers the advantage that it becomes easy and less costly to realize demodulations known by the name of <<0 demodulation>>.

These and other aspects of the invention are apparent from and will be elucidated with reference to the embodiments described hereinafter.

DESCRIPTION OF THE PREFERRED EMBODIMENTS

Figure 1:
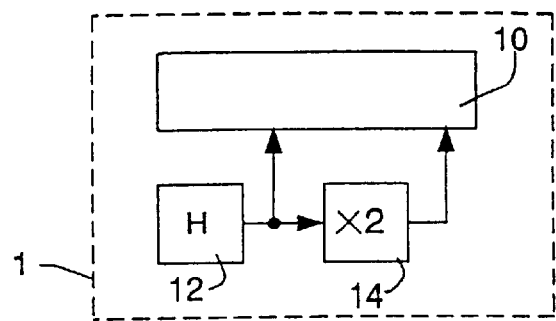
FIG. 1 shows a device according to the invention.

FIG. 1 shows a device according to the invention, which is referenced 1. This device 1 comprises, for example, a receiving head end 10 receiving high-frequency signals. This head end calls for a high-frequency local oscillator. To obtain this frequency, a periodic signal generator 12 is used and at least a frequency doubler circuit 14.

Figure 2:
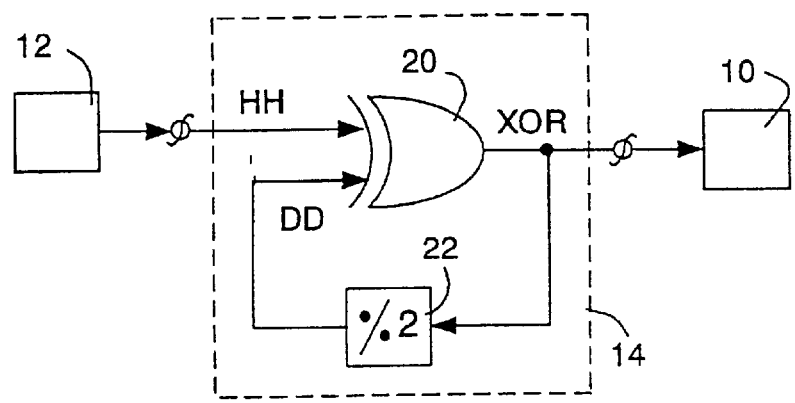
FIG. 2 shows the diagram of a frequency multiplier circuit according to the invention.

FIG. 2 shows an electrical diagram of the frequency divider circuit 14. It is formed by an <<EXCLUSIVE-OR>> gate bearing reference 20. This gate has an output for producing in this described example the signal at double frequency, and has two inputs. A first input which is connected to the output of the generator 12 receives the signal whose frequency is to be doubled, and, in accordance with the invention, the second input is connected to the output via a frequency divider 22.

Figure 3:
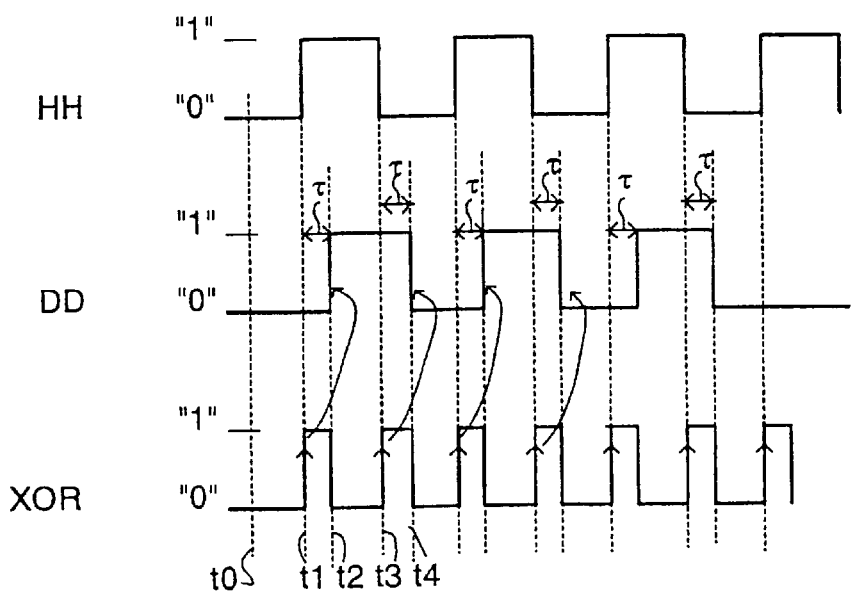
FIG. 3 shows a time diagram explaining the operation of the frequency multiplier circuit.

The operation of the circuit 14 is explained with the help of FIG. 3. This Figure is a time diagram of the various signals present in this circuit. The line HH represents the signals present on the first input of the gate 20. The line DD represents the shape of the signals present on the second input and the line XOR the signals produced by the circuits 14, thus on the output of the gate 20.

An instant t0 is considered where the value of the signals HH, DD and XOR is equal to <<0>> and it is supposed that the frequency divider 22 is initialized and that the value of its output signal will change for each rising edge of the signal applied to its input, this signal being the signal XOR.

At the instant t1, the signal HH assumes the value <<1>>, which causes the signal XOR also to assume the value <<1>>. This first low-to-high transition of the signal XOR will modify the output signal DD of the divider 22 at the instant t2. This instant t2 occurs after a time duration τ equal to the transfer time of the divider 22. The moment that the signal DD on the output of the divider 22 assumes the value <<1>>, there is an inversion of the gate output signal XOR, so that the signal XOR assumes the value <<0>>. At the instant t3 a transition of the signal HH occurs, thus the signal XOR changes value, exhibiting a transition from low to high which, at a time t4, after time τ, causes the state of the signal on the output of the divider 22 to change. Thus, the signal XOR is a signal having twice the frequency of that of the signal HH.

Figure 4:
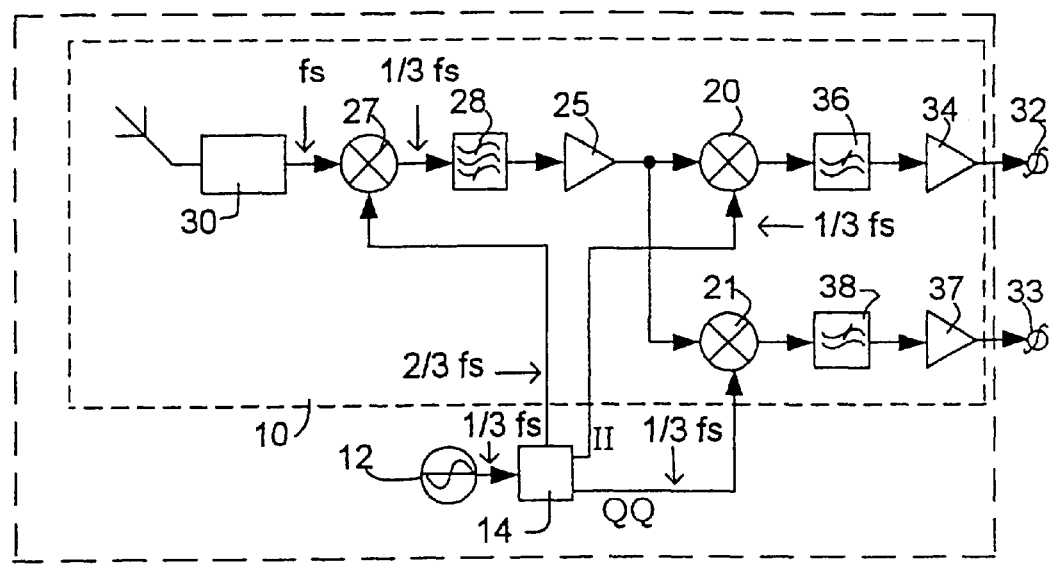
FIG. 4 shows another device according to the invention.

FIG. 4 shows another device according to the invention. This type of device is described, for example, in the specification of the circuit UAA3500HL manufactured by Philips Semiconductors. The receiving head end 10 of this device comprises, in essence, a demodulator known by the name of <<0-demodulator>>. To obtain this demodulation, two mixers 20 and 21 are used which receive the signals which are to be demodulated and come from an amplifier 25. The carrier frequency of these signals on the input of the mixers 20 and 21 is equal to ⅓ fs. These signals are mixed with local signals, whose frequency is also equal to ⅓ fs but are phase quadrature signals. The signals applied to these mixers have undergone a change of frequency effected by a mixer 27 and a filtering by the filter 28. The mixer 27 receives the signals to be demodulated, transmitted with a carrier equal to fs so as to give the value ⅓ fs to this carrier. These carrier signals fs come from the first stage 30 of the head end 10. The signals produced by this head end 10 are rendered available on the terminals 32 and 33. The terminal 32 is connected to the output of the mixer 20 via an amplifier 34 and a filter 36, whereas the terminal 33 is connected to the output of the mixer 21 via an amplifier 37 and a filter 38.

The signals supplied to the mixers 20, 21 and 27 are produced by the frequency multiplier circuit 14 realized in conformity with the invention and which further supplies, without too much additional expenditure, the signals II and QQ in phase quadrature to the mixers 20 and 21. The multiplier circuit 14 utilizes the signals coming from the oscillator 12 of which the oscillation frequency is equal to ⅓ fs.

Figure 5:
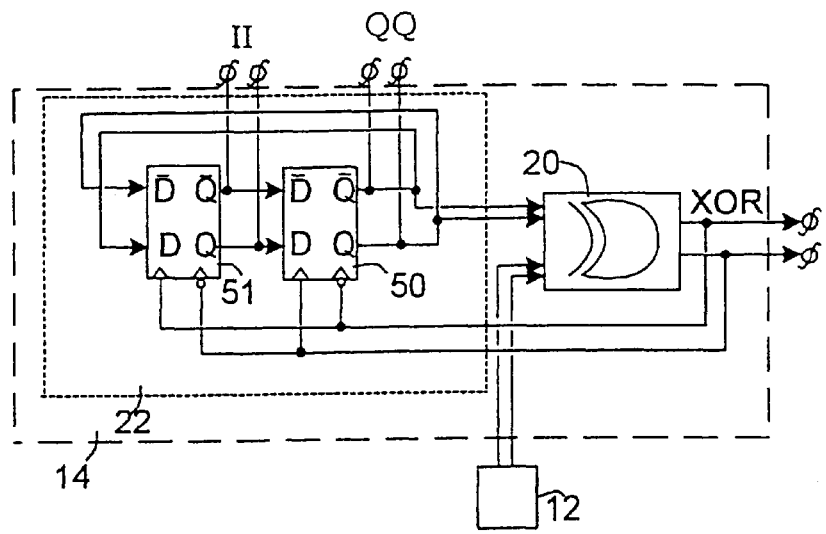
FIG. 5 shows a frequency multiplier circuit used in the device shown in FIG. 4.

FIG. 5 shows the structure of the frequency multiplier circuit 14. It operates systematically with the signals and their complements which is a characteristic feature of the CML logic mentioned above. The gate 20 thus works with complementary signals. The divider 22 is formed by two D-flip-flops 50 and 51 while also the complementary signals are taken into account. The signal II is tapped from the outputs of the flip-flop 51 and the signal QQ from the output of the flip-flop 50. It is this signal QQ that is applied to the first inputs of the <<EXCLUSIVE-OR>> circuit 20. The clock inputs of these flip-flops are connected to the outputs of the circuit 20.

Figure 6:
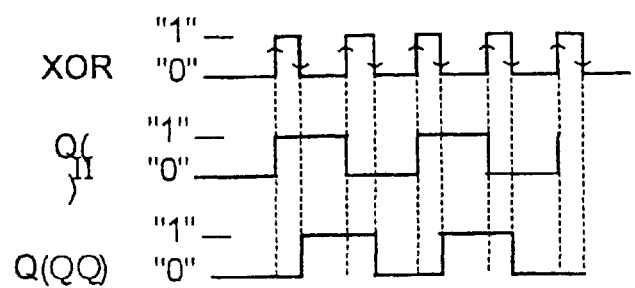
FIG. 6 shows a time diagram explaining the operation of the frequency multiplier circuit shown in FIG. 4.

The time diagram in FIG. 6 explains the formation of the signals Q(II) and Q(QQ) on the outputs of the flip-flops 51 and 50, respectively. The signal whose frequency is divided is the signal XOR available on the output of the circuit of the circuit 20. As these flip-flops are active at the rising and falling edges, the signals are phase shifted by an active edge. If the duty cycle of the signal XOR is equal to 0.5 (that is to say, that the period of time during which this signal has a valve <<0>> is equal to the period of time during which the signal has the value <<1>>, then one has a phase shift equal to Π/2. This may be obtained by making, for example, the parameter τ vary.

Although the various signals are represented in rectangular form, the signals have in fact a sinusoidal shape due to the fact that, on the one hand, these signals are high-frequency signals and, on the other hand, these circuits, which present an inherent way of high-frequency limitation, do not allow the high-rank harmonics of the signals to pass.

Figure 7:
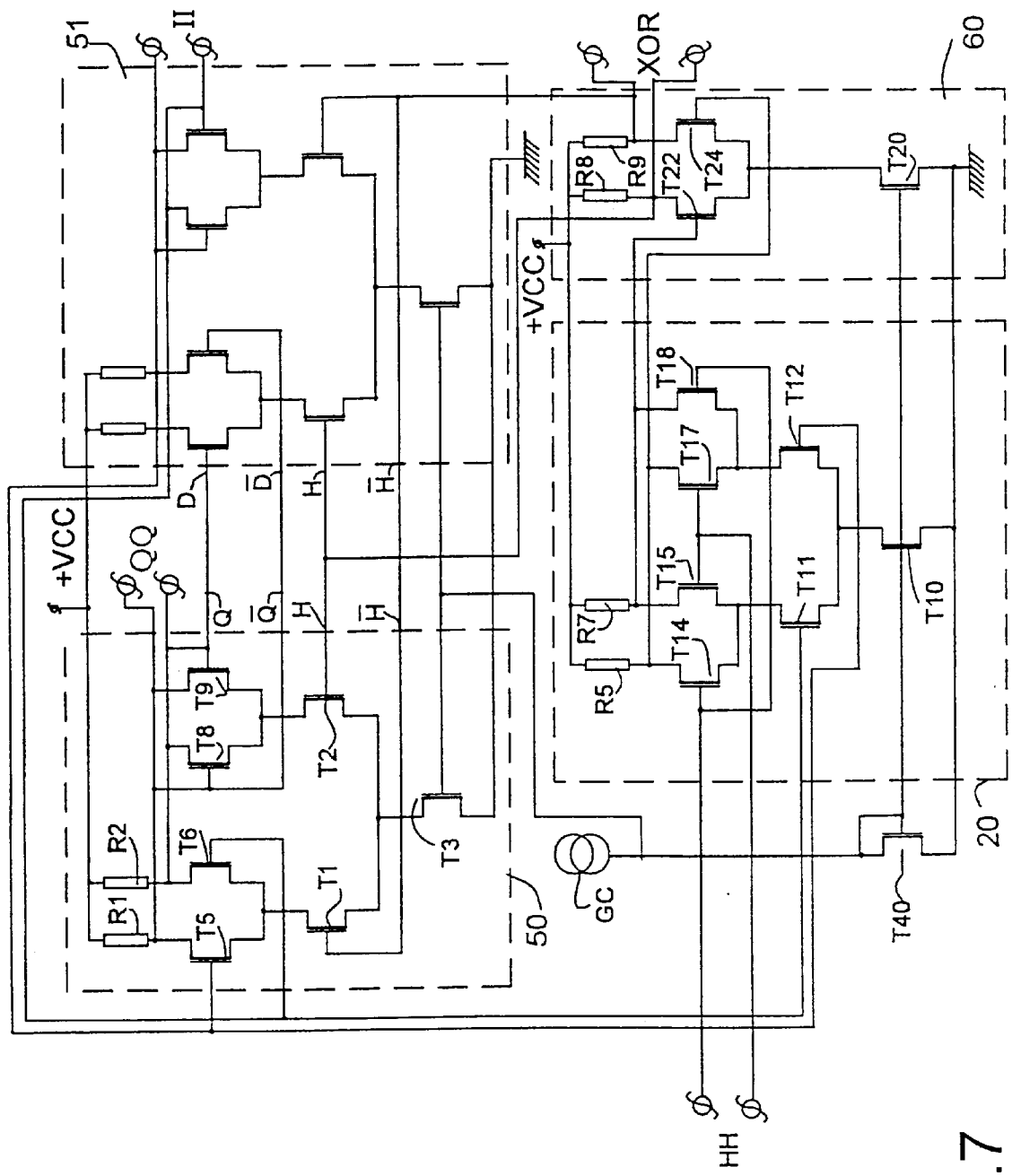
FIG. 7 shows an example of an embodiment of a frequency multiplier circuit of the type shown in FIG. 4, realized in the logic called CML.

FIG. 7 shows the preferred embodiment of a frequency multiplier circuit realized in CML logic.

The flip-flops 50 and 51 have identical structures and only the structure of flip-flop 50 will be explained. It is formed by a first symmetrical arrangement formed by the transistors T1 and T2, whose source electrode is connected to the drain of a transistor T3. The gate of this transistor T3 is supplied with power by a current generator GC. Each of the transistors T1 and T2 supplies power to a pair of transistors T5 and T6 for the first transistor and T8 and T9 for the second transistor. The drains of the transistors T5 and T9 are connected to a resistor R1, whereas the drains of the transistors T6 and T8 are connected to a resistor R2. The ends of these resistors, which are not connected to the drains, receive the supply voltage VCC. The complementary signals QQ are tapped from the junction points of the resistors and the drain of the transistors which are connected thereto. These output signals QQ are connected to the inputs H of the flip-flop 51. The inputs H of the flip-flop 50 are formed by the gates of the transistors T1 and T2. The transistor T3, which co-operates with the current generator GC, supplies power to the sources of the transistors T1 and T2.

The <<EXCLUSIVE-OR>> circuit 20 is formed by a first transistor T10 whose source is connected to ground just like that of transistor T3 and whose drain is connected to the sources of two transistors T11 and T12 whose gates receive the signals II. The drains of the transistors T11 and T12 are connected to two transistor pairs respectively, that is to say, the transistors T14 and T15 for the first pair and the transistors T17 and T18 for the second pair. The drains of the transistors T14 and T17 are connected to one end of a resistor R5 whose other end receives the supply voltage VCC. Similarly, the drains of the transistors T15 and T18 are connected to one end of another resistor R7 whose other end also receives the supply voltage VCC. The gates of the transistors T14, T15, T17 and T18 receive the signals HH whose frequency one wishes to multiply. The output signals of the circuit 20, tapped from the junction points of the resistors R5 and R7 with the drain of the transistors connected thereto, are connected to the inputs of a buffer amplifier 60.

This amplifier 60 is formed by a pair of transistors arranged as a differential pair supplied with power by a transistor T20. The pair is formed by two transistors T22 and T24 whose sources are connected to the drain of the transistor T20 and whose drains are connected to the first ends of the resistors R8 and R9. The other ends of these resistors receive the supply voltage VCC. The gates of these transistors form the input to the amplifier 60, whereas their drains form the output. The gates of the transistors T3, T10 and T20 are connected to the gate of a transistor T40 whose drain is connected both to its gate and to the current generator GC to thus form a current mirror.

It should be observed that the frequency multiplier circuit can operate with multiplication ratios different from two as has been described, by changing the division factor of the frequency divider.

What is claimed is:

1. An electronic device comprising: a periodic signal generator and a frequency multiplier circuit for multiplying the frequency of the periodic signal generated by the periodic signal generator, wherein the frequency multiplier circuit includes an EXCLUSIVE-OR, gate which receives said periodic signal, characterized in that the frequency multiplier circuit comprises a frequency divider circuit connected between an output and an input of said EXCLUSIVE-OR gate and that said frequency multiplier circuit has first and second outputs for producing first and second signals phase shifted by 90° at the frequency of the periodic signal.

2. A device as claimed in claim 1, characterized in that said first and second outputs are formed by respective first and second junction points of the frequency divider circuit.

3. A device as claimed in claim 1, characterized in that said frequency multiplier circuit is realized in current mode logic.

4. A device as claimed in claim 1, characterized in that the frequency divider circuit includes first and second flip-flops having flip-flop inputs and whose states change with each rising or falling edge of the signals applied to their flip-flop inputs.

5. A device as claimed in claim 4, characterized in that said first and second outputs are connected to respective outputs of said first and second flip-flops.

6. A device as claimed in claim 1 wherein the frequency divider circuit comprises:

first and second D-type flip-flops coupled in cascade to said input of the EXCLUSIVE-OR gate, and said EXCLUSIVE-OR gate has a further input which receives said periodic signal and forms the input of the frequency multiplier circuit.

7. A device as claimed in claim 6 wherein the frequency divider circuit comprises first output means coupled to the output of the EXCLUSIVE-OR circuit for supplying an output signal at a frequency multiple of the periodic signal, and the first and second outputs are coupled to first and second outputs of the first and second flip-flops, respectively, for producing the first and second signals phase-shifted by 90° at the frequency of the periodic signal.

8. A device as claimed in claim 1 wherein the frequency divider circuit has a division factor other than two.

9. A frequency multiplier circuit comprising:
   an EXCLUSIVE-OR gate having a first input which receives a periodic signal whose frequency is to be multiplied,
   a frequency divider circuit coupled between an output of the EXCLUSIVE-OR gate and a second input thereof, wherein the frequency divider circuit comprises:
   first and second feedback coupled bistable circuits coupled in cascade to the second input of the EXCLUSIVE-OR gate with each bistable circuit having input means coupled to the output of the EXCLUSIVE-OR gate, and
   first and second output means coupled to first and second outputs of the first and second bistable circuits, respectively, for producing first and second signals phase-shifted by 90° at the frequency of the periodic signal, and wherein the output of the EXCLUSIVE-OR gate forms the output of the frequency multiplier circuit.

10. The frequency multiplier circuit as claimed in claim 9 wherein the frequency divider circuit has a division factor other than two.

11. A frequency multiplier circuit comprising: an EXCLUSIVE-OR gate which receives a periodic signal whose frequency is to be multiplied, a frequency divider circuit connected between an output and an input of said EXCLUSIVE-OR gate, wherein the output of the EXCLUSIVE-OR gate forms the output of said multiplier circuit, and another input of the EXCLUSIVE-OR gate receives the periodic signal whose frequency is to be multiplied and forms the input of the multiplier circuit, and first and second outputs for producing first and second signals phase-shifted by 90° at the frequency of the periodic signal, wherein said first and second outputs comprise respective first and second junction points of the frequency divider circuit.

12. The frequency multiplier circuit as claimed in claim 11 wherein the frequency divider circuit has a division factor other than two whereby the frequency of the periodic signal at the output of the multiplier circuit is multiplied by a factor other than two.

* * * * *